US011823760B2

(12) United States Patent
Lee (10) Patent No.: US 11,823,760 B2
(45) Date of Patent: Nov. 21, 2023

(54) SYSTEM AND METHOD FOR DATA INTEGRITY IN MEMORY SYSTEMS THAT INCLUDE QUASI-VOLATILE MEMORY CIRCUITS

(71) Applicant: SUNRISE MEMORY CORPORATION, San Jose, CA (US)

(72) Inventor: Frank Sai-keung Lee, San Jose, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 17/512,449

(22) Filed: Oct. 27, 2021

(65) Prior Publication Data

US 2022/0148670 A1   May 12, 2022

Related U.S. Application Data

(60) Provisional application No. 63/112,108, filed on Nov. 10, 2020.

(51) Int. Cl.
*G11C 29/42* (2006.01)
*G11C 29/52* (2006.01)
*G11C 29/18* (2006.01)
*G11C 29/12* (2006.01)

(52) U.S. Cl.
CPC .......... *G11C 29/42* (2013.01); *G11C 29/1201* (2013.01); *G11C 29/18* (2013.01); *G11C 29/52* (2013.01)

(58) Field of Classification Search
CPC ..... G11C 29/42; G11C 29/1201; G11C 29/18; G11C 29/52; G11C 2029/0411
See application file for complete search history.

(56) References Cited

U.S. PATENT DOCUMENTS 6,367,046 B1 *  4/2002  Chapman ............ G06F 11/1008
                                              714/752
2004/0221098 A1 * 11/2004  Ito ........................ G11C 11/406
                                              711/106

(Continued)

*Primary Examiner* — Steve N Nguyen
(74) *Attorney, Agent, or Firm* — Edward C. Kwok; VLP Law Group LLP (57) ABSTRACT

A memory system includes: (a) a memory array including numerous quasi-volatile ("QV") memory units each configured to store a first portion of a code word encoded using an error-detecting and error-correcting code ("ECC-encoded code word"); (b) a refresh circuit for reading and writing back the first portion of the ECC-encoded code word of a selected one of the QV memory unit; (c) a global parity evaluation circuit configured to determine a global parity of the ECC-encoded code word of the selected QV memory unit; and a memory controller configured for controlling operations carried out in the memory array, wherein when the global parity of the ECC-encoded code word of the selected QV memory unit is determined at the global parity evaluation circuit to be a predetermined parity, the memory controller (i) performs error correction on the selected ECC-encoded code word and (ii) causes the first portion of the corrected ECC-encoded code word to be written back to the selected QV memory unit, instead of the refresh circuit writing back the first portion of the ECC-encoded code word.

38 Claims, 6 Drawing Sheets

(56) References Cited

U.S. PATENT DOCUMENTS

| | | | |
|---|---|---|---|
| 2006/0056258 A1* | 3/2006 | Eto | G11C 11/4076 365/222 |
| 2007/0079140 A1* | 4/2007 | Metzger | G06F 21/6245 713/189 |
| 2007/0091678 A1* | 4/2007 | Kato | G11C 16/32 365/185.09 |
| 2010/0329063 A1* | 12/2010 | Cho | G11C 5/148 365/230.03 |
| 2013/0111123 A1* | 5/2013 | Thayer | G06F 3/0671 711/105 |
| 2013/0254441 A1* | 9/2013 | Kipnis | H03M 7/3079 710/68 |
| 2013/0318418 A1* | 11/2013 | Bedeschi | G11C 29/028 714/E11.032 |
| 2015/0100852 A1* | 4/2015 | Huang | G06F 11/1052 714/773 |
| 2017/0069398 A1* | 3/2017 | Park | G11C 29/50016 |
| 2017/0092371 A1* | 3/2017 | Harari | G11C 16/0483 |
| 2018/0011762 A1* | 1/2018 | Klein | G06F 11/1072 |
| 2018/0253347 A1* | 9/2018 | Shigeta | G06F 11/08 |
| 2018/0349645 A1* | 12/2018 | Helmick | G06F 21/60 |
| 2019/0087587 A1* | 3/2019 | Li | G11C 13/0038 |

\* cited by examiner

SYSTEM AND METHOD FOR DATA INTEGRITY IN MEMORY SYSTEMS THAT INCLUDE QUASI-VOLATILE MEMORY CIRCUITS

CROSS-REFERENCE TO RELATED APPLICATIONS

The present application relates to and claims priority of U.S. provisional patent application ("Provisional Application"), Ser. No. 63/112,108, entitled "System And Method For Data Integrity In Memory Systems That Include Quasi-Volatile Memory Circuits," filed on Nov. 10, 2020. The Provisional Patent Application is hereby incorporated by reference in its entirety.

BACKGROUND OF THE INVENTION

1. Field of the Invention

The present invention relates to quasi-volatile (QV) memory or data storage systems. In particular, the present invention relates to data integrity in QV memory or data storage systems.

2. Discussion of the Related Art

Until recently, conventional memory circuits are divided into "volatile" and "non-volatile" categories. Volatile memory circuits include, for example, dynamic random-access memory (DRAM) circuits and static random-access memory (SRAM) circuits. An SRAM circuit retains its data so long as it is powered. A DRAM circuit, however, retains its data only for a short time period ("data retention period"; e.g., 100 milliseconds), even when it is powered. To prevent data loss, a DRAM circuit requires its controller to operate a "refresh" mechanism by which the data stored in the DRAM circuit is read and written back repetitively at intervals shorter than its data retention period. Like an SRAM circuit, a DRAM circuit loses all its data when power is withdrawn. Non-volatile memory circuits (e.g., flash memory circuits) have very long data retention periods (e.g., tens of years) and retain their data even when power is withdrawn.

U.S. Pat. No. 10,121,553 (the '553 patent), entitled "Capacitive-Coupled Non-Volatile Thin-film Transistor NOR Strings in Three-Dimensional Arrays," filed on Aug. 26, 2016 and issued on Nov. 6, 2018, discloses a memory circuit that includes memory or storage transistors that are organized as 3-dimensional arrays of NOR strings. A storage transistor in the '553 patent's memory circuit has a data retention time that is in the order of tens of minutes and longer, retaining its data during that data retention period, even when powered is interrupted. Like a DRAM circuit, a refresh mechanism may be used in the '553 patent's memory circuit to prevent data loss. Of course, the '553 patent's memory circuit need not be refreshed as frequently as a DRAM circuit. In this detailed description, a memory circuit that requires a refresh operation to prevent data loss and that retains its data for a time period even when power is interrupted is referred to herein as a "quasi-volatile" (QV) memory circuit.

In many applications, for data security reasons (e.g., privacy and confidentiality concerns), because of its non-transitory nature—i.e., data is retained even after power is withdrawn—data stored in a non-volatile memory circuit is preferably encrypted to prevent unauthorized access and tempering. For a QV memory circuit, although its data retention time is short relative to non-volatile memory circuits, the stored data's non-transitory nature makes it desirable that the data stored in a QV memory circuit to be encrypted, especially in applications involving confidential or sensitive data. Conventional encryption schemes, e.g., the Advanced Encryption Standard (AES), are known to those of ordinary skill in the art.

In addition, although data losses due to random or other physical processes are rare, some data losses inevitably occur when large amounts of information are stored. It is preferable to be able to detect and, preferably, recover from such data losses. Conventional memory circuits (e.g., DRAM circuits) and many mass storage devices (e.g., magnetic disk drives and solid-state drives) use various hashing and encoding schemes to allow errors in the stored data to be detected and, even more desirably, corrected. Error correction prevents data losses. Conventional encoding techniques include, for example, use of error detection and error correcting codes. Some examples of error detection and correction codes include Hamming and higher order codes (e.g., BCH codes), as is known to those of ordinary skill in the art.

In this detailed description, the term "data integrity" encompasses all data security, error detection and error correction concerns.

SUMMARY

According to one embodiment of the present invention, a memory system includes: (a) a memory array including numerous quasi-volatile ("QV") memory units each configured to store a first portion of a code word encoded using an error-detecting and error-correcting code ("ECC-encoded code word"); (b) a refresh circuit for reading and writing back the first portion of the ECC-encoded code word of a selected one of the QV memory unit; (c) a global parity evaluation circuit configured to determine a global parity of the ECC-encoded code word of the selected QV memory unit; and a memory controller configured for controlling operations carried out in the memory array, wherein when the global parity of the ECC-encoded code word of the selected QV memory unit is determined at the global parity evaluation circuit to be a predetermined parity, the memory controller (i) performs error correction on the selected ECC-encoded code word and (ii) causes the first portion of the corrected ECC-encoded code word to be written back to the selected QV memory unit, instead of the refresh circuit writing back the first portion of the ECC-encoded code word. In one embodiment, the predetermined global parity indicates an odd number of errors in the ECC-encoded code word. The ECC-encoded code word preferably has an even Hamming distance.

In one embodiment, the first portion of the ECC-encoded code word includes a check bits field and an ECC-encoded code includes an encrypted datum. The ECC-encoded code word may further include a second portion representing information regarding the encrypted datum, and wherein the second portion is not stored in one of the QV memory units. The information may represent a logical address designating one of the memory units. The second portion may be expressed as a hash value of the information.

In one embodiment, each memory unit includes a page of data that is written or read using an ECC-encoded code word.

In one embodiment, the memory controller and the memory array communicate over an interface implementing connections by wafer-bonding or hybrid bonding, or through an interposer structure.

In one embodiment, an interface to a host memory system allows a host computer to send read and write requests to the controller. The write request may specify an encrypted datum, or a datum expressed in clear text. When the write request specifies a clear text datum, a data security circuit in the controller encrypts the clear text datum. The controller may further include an error-detecting and error correcting (ECC) circuit that encodes the encrypted datum into the ECC-encoded code word. The ECC circuit may include an ECC syndrome generator that derives from the ECC-encoded code word information for detecting up to a predetermined number of errors in the ECC-encoded code word. The ECC circuit may further include an ECC correction circuit that corrects the detected errors in the ECC-encoded code word.

According to one embodiment of the present invention, a method for data integrity is provided in a memory array that includes numerous QV memory units each configured to store a first portion of an ECC-encoded code word. The method includes: (a) during a refresh operation on a selected one of the QV memory units, reading the first portion of the ECC-encoded code word of the selected QV memory unit; (b) determining a global parity of the ECC-encoded code word of the selected QV memory unit; and (c) when the global parity of the ECC-encoded code word of the selected QV memory unit is determined to be a predetermined parity, a memory controller (i) performs error correction on the selected ECC-encoded code word and (ii) causes the first portion of the corrected ECC-encoded code word to be written back to the selected QV memory unit.

The present invention is better understood upon consideration of the detailed description below, in conjunction with the accompanying drawings.

BRIEF DESCRIPTION OF THE DRAWINGS

FIGS. 2(a), (b), (c), (d) and (e) illustrate a multi-round encryption or decryption process under AES using pipeline 200 on 512-bit data blocks, in accordance with one embodiment of the present invention.

DETAILED DESCRIPTION OF THE PREFERRED EMBODIMENTS

Figure 1:
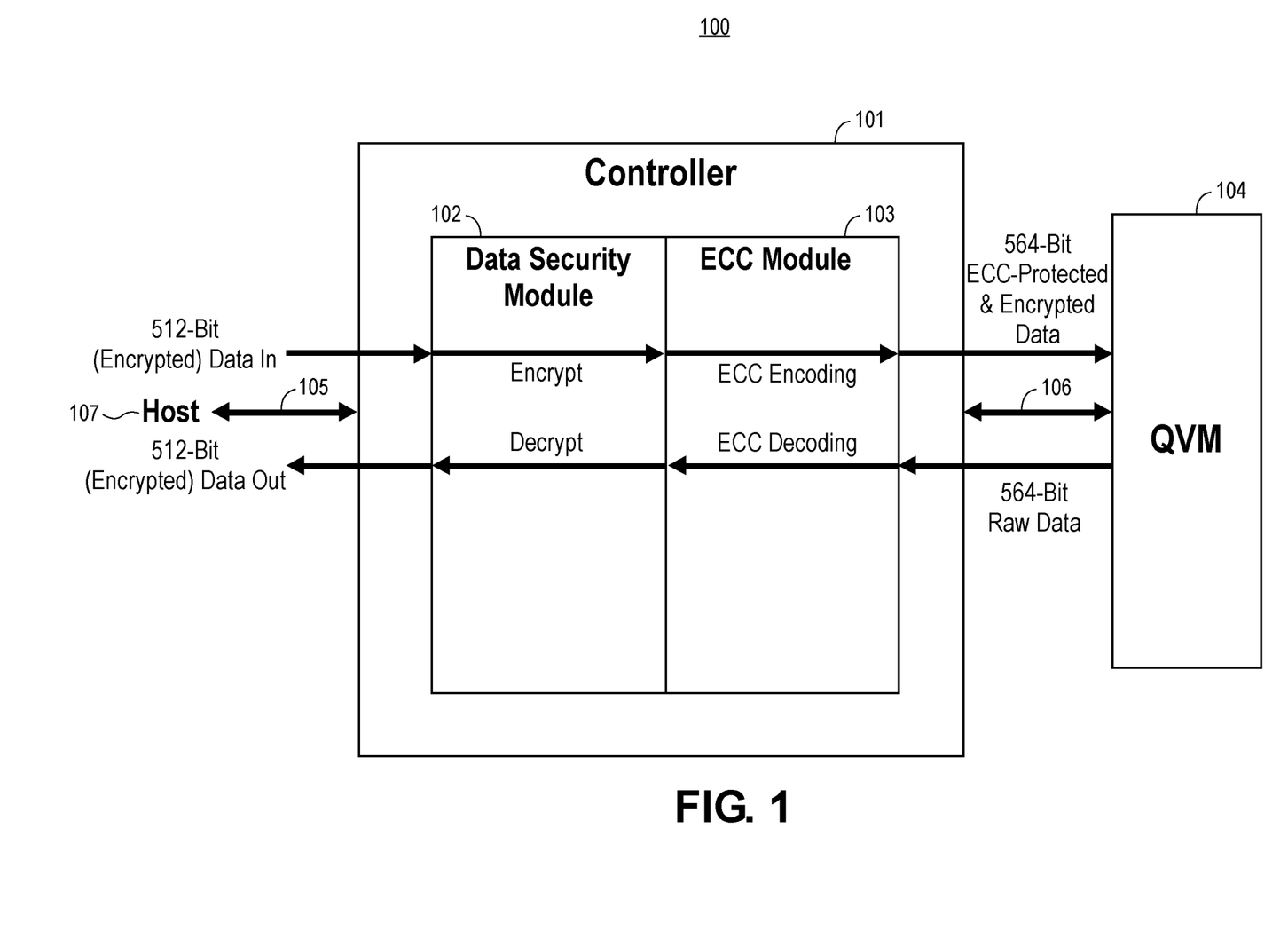
FIG. 1 illustrates data integrity operations of memory system 100, which includes controller 101 and QV memory 104, according to one embodiment of the present invention.

FIG. 1 illustrates data integrity operations of memory system 100, which includes controller 101 and QV memory 104, according to one embodiment of the present invention. Controller 101 includes interface 105 over which it communicates with host computer system 107, receiving read and write requests from host computer system 107 to access QV memory 104. Interface 105 may be, for example, an industry standard memory interface (e.g., a DDR5 SDRAM interface) or an industry standard peripheral interface (e.g., PCI-e interface). In this embodiment, each read or write request from host computer system 107 involves 64 bytes of data (i.e., 512 bits). Host computer system 107 may provide controller 101 encrypted data to be written into QV memory 104 and may receive encrypted data when read back form QV memory 104 in a subsequent read operation. As described above, many applications require or prefer storing encrypted data in QV memory 104. Therefore, if host computer system 107 provides the data in clear text, controller 101 may encrypt the data prior to writing it into QV memory 104 and may decrypt the data read from QV memory 104 prior to providing it to host computer system 107. Even when host computer system 107 provides encrypted data, controller 101 may still further encrypt the data prior to writing it into QV memory 104 to provide an additional level of security (e.g., to prevent unintended access across accounts or processes).

As shown in FIG. 1, to ensure data integrity, controller 101 includes data security module 102 and error detection and correction module 103. (As the purpose of FIG. 1 is to highlight the encryption and error detection and correction functions of controller 101, conventional controller functions known to those of ordinary skill in the art are not shown and their descriptions omitted.) Error detection and correction module 103 detects and corrects errors that arise in QV memory 103, based on encoding the stored data using error correction codes ("ECC encoding"). Thus, in this description, error detection and correction module 103 is also referred to as ECC module 103. Data received from host computer system 107 over interface 105 is first encrypted in data security module 102 and then ECC-encoded in EEC module 103. After ECC-encoding, controller 101 sends the ECC-encoded data to QV memory 104 over interface 106 for writing into a designated physical address. Interface 106 may be any suitable data interface, but preferably a high-bandwidth interface. Such a high-bandwidth interface may be implemented, for example, through an interposer structure, or by wafer-bonding or hybrid bonding between a semiconductor die of QV memory 104 and the semiconductor die on which data security module 102 and ECC module 103 are formed. Data encryption is preferably performed on the data before ECC-encoding and the subsequent write of the ECC-encoded data into QV memory 104. For data encrypted and ECC-encoded in that sequence, the subsequent decryption of the data read from QV memory 104 is performed after ECC-decoding. Otherwise, an error in the encrypted data read from QV memory 104 may propagate into multiple error bits in the decrypted data.

In some embodiments, these data security operations may be carried out, preferably and predominantly, in dedicated circuitry driven by controller 101's firmware. For example, to implement AES in one embodiment, the 512-bit datum is divided into four 128-bit blocks, each of which may be independently encrypted. Encryption under AES's electronic codebook mode (ECB) may be implemented by a multi-round process, with the number of rounds being dependent on key length. For example, 128-bit, 192-bit and 256-bit encryptions require 10, 12 and 14 rounds of encryption, respectively. In each round, a "round subkey" is multiplied with partially encrypted data passed from the previous round. Each round subkey is expanded (i.e., generated) from an encryption key. Decryption is achieved substantially in the reverse manner from encryption.

Figures 2A, 2B:
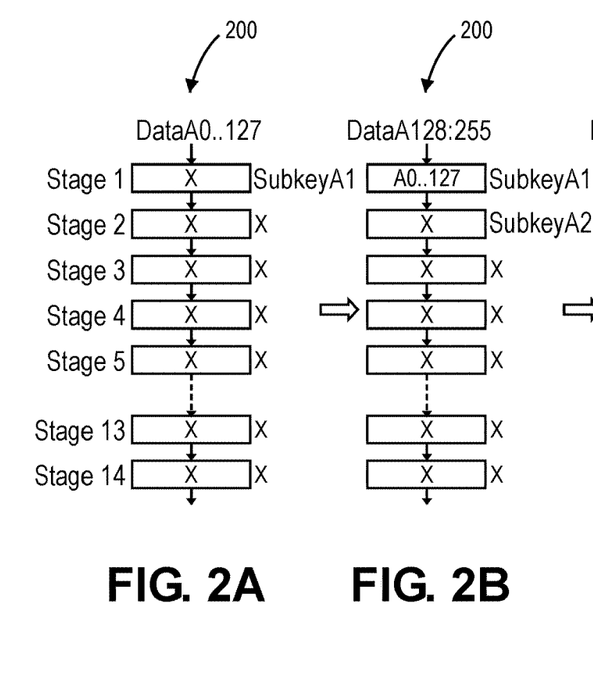
Figures 2C, 2D, 2E:
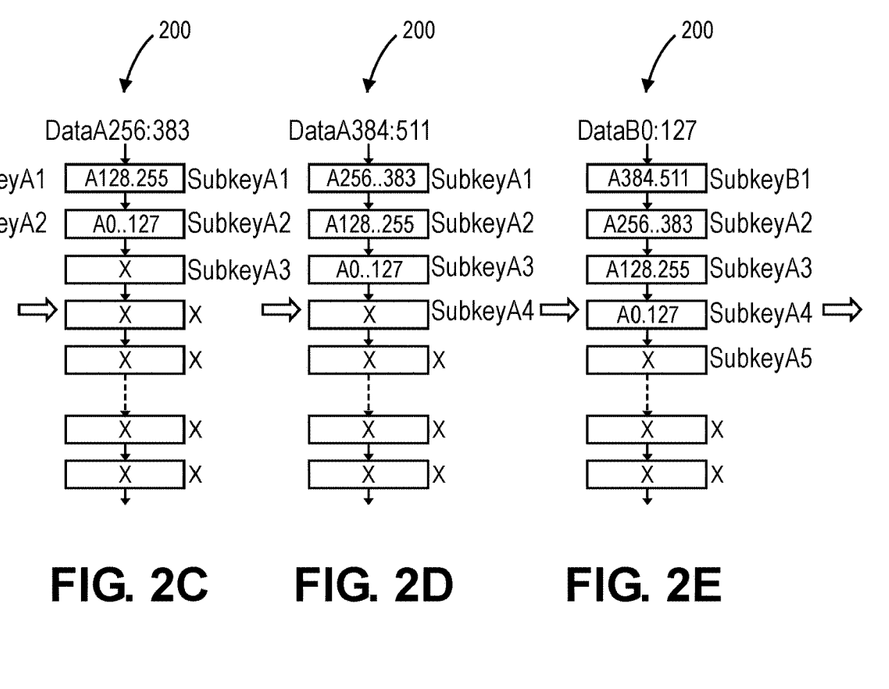

FIGS. 2(a)-2(e) illustrate a multi-round encryption or decryption process under AES using pipeline 200 on 512-bit data blocks, in accordance with one embodiment of the present invention. As shown in FIGS. 2(a)-2(e), pipeline 200 includes 14 stages, with each stage processing a 128-bit data block. As configured, pipeline 200 may support in ECB-mode encryption by an encryption key of up to 256 bits. Further, in a cache application, each 512-bit may be a cache line that includes data that originate from different data sources, and thus may be associated with different encryption keys. For example, FIGS. 2(a)-2(d) illustrate 128-bit data blocks DataA0 . . . 127, DataA128 . . . 255, DataA256 . . . 383 and DataA384 . . . 511-bit datum, which together form 512-bit datum DataA, being respectively presented in four consecutive cycles to pipeline 200. FIG. 2(e) shows, following the cycle of FIG. 2(d), the first of four 128-bit data blocks forming 512-bit datum DataB (i.e., DataB0 . . . 127) being presented to pipeline 200. DataA and DataB are to be encrypted using two different encryption keys (and thus two different sets of round subkeys). Their round subkeys may be expanded upon selection, stored away, and retrieved for use at the time of data encryption and data decryption operations.

Initially, as shown in FIG. 2(a), in anticipation of latching 128-bit datum DataA0 . . . 127, stage 1 of pipeline 200 is configured for encryption using round subkey SubkeyA1. In the following cycle, as shown in FIG. 2(b), DataA0 . . . 127 is latched into stage 1 of pipeline 200, where it is encrypted using previously configured round subkey SubkeyA1, while datum DataA128-255 is presented for encryption at pipeline 200. At the same time, stage 2 of pipeline 200 is configured for encryption using round subkey SubkeyA2, in anticipation of DataA0 . . . 127 being processed in stage 2 of pipeline 200 in the next cycle. FIGS. 2(c)-2(d) show, respectively, the two cycles following the cycle of FIG. 2(b), in which stages 3 and 4 of pipeline 200 are successively configured for encryption using round subkeys SubkeyA3 and SubkeyA4. Datum DataA0 . . . 127 is encrypted using round keys SubkeyA2 and SubkeyA1, respectively, in the cycles of FIGS. 2(c) and 2(d). FIG. 2(e) shows datum DataB0 . . . 127, the first of four 128-bit data blocks forming 512-bit datum DataB, being presented to pipeline 200. As DataA and DataB are being encrypted using different encryption keys, during the cycle of FIG. 2(e), stage 1 of pipeline 200 is being configured for encryption using round subkey SubkeyB0. The configuration may be performed after datum DataA383 . . . 511 is encrypted and before the encrypted datum is output to stage 2. For non-electronic codebook ("non-ECB") encryption modes, initialization vectors may be reset at cache line boundaries.

As shown in FIG. 1, encrypted data is passed from data security module 102 to ECC module 103 for ECC encoding. The ECC-encoding to be used in ECC module 103 may be determined according to a system failure figure of merit referred to as "failures in time" or FIT. In the industry, the unit "FIT" represents 1.0 failure in a billion ($10^9$) hours of operation. Conventional memory systems have used this figure of merit to characterize their data integrity performance. Some DRAM circuits, for example, has a raw error rate ($P_{raw}$) of $7.13 \times 10^{-14}$, which allows the DRAM circuits to achieve 1 FIT using a single-error correction and double-error detection (SEC/DED) code.

In one embodiment, each access to a 512-bit memory page in QV memory 104 requires 2.5 ns, so that $10^9$ hours of operation allows in theory $1.44 \times 10^{21}$ accesses. To achieve a performance of less than 1.0 FIT, the ECC encoding should reduce the probability of failure (i.e., occurrence rate of an uncorrectable ECC-encoded block) to less than $6.9 \times 10^{-22}$. If QV memory 102 has a $P_{raw}$ that is $1.0 \times 10^{-6}$, a failure rate of less than 1.0 FIT may be achieved using a 5-error correcting/6-error detecting code. (At this time, the industry does not have sufficient experience with QV memories; $P_{raw} = 1.0 \times 10^{-6}$ is merely an educated guess of the likely raw error rate.) A 5-error correcting/6-error detecting code would have a Hamming distance of 12 (i.e., any two codewords differ by at least 12 bits). A 6-error correcting code would match the performance of a DRAM circuit that corresponds to a $P_{raw} = 1.0 \times 10^{-15}$, with ECC-encoded data under a SEC/DED code.

Figure 3A:
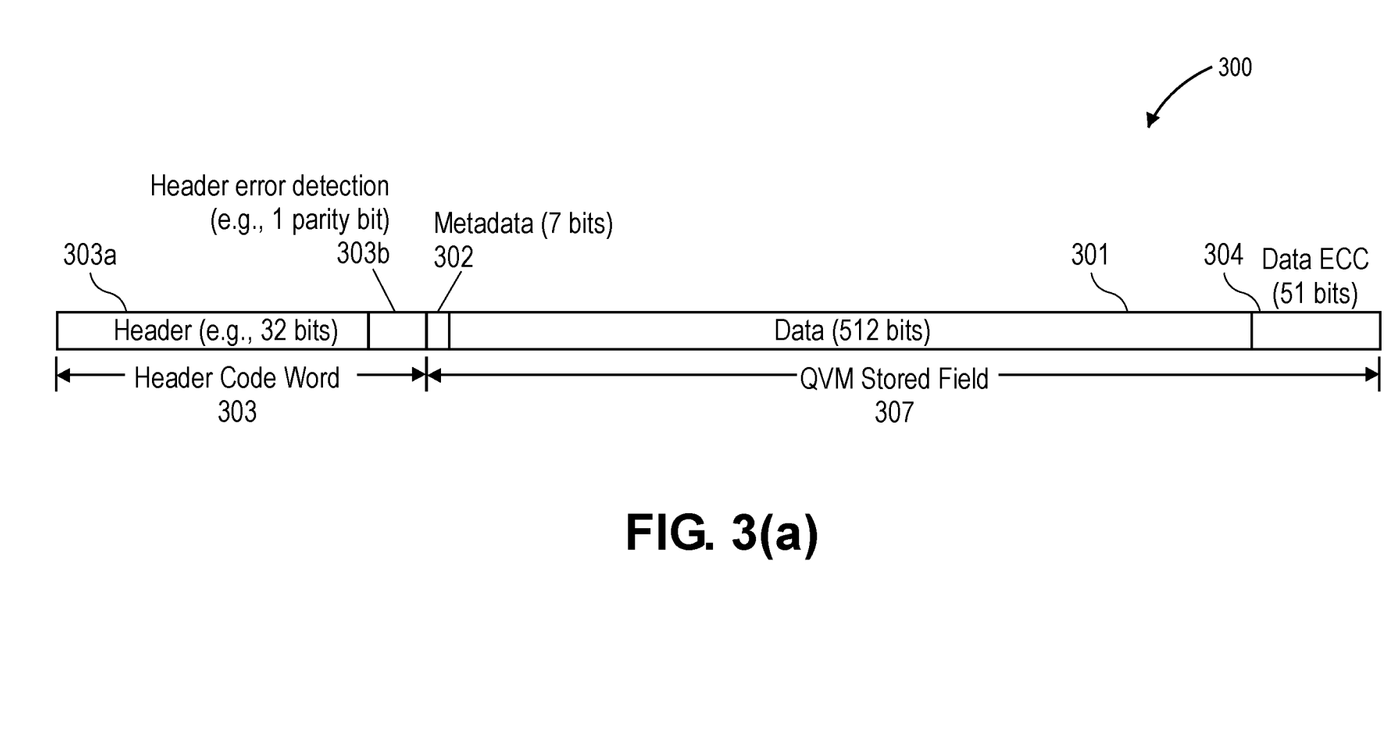
FIG. 3(a) shows data block 300, which exemplifies an ECC-encoded data block created by ECC module 103, in accordance of one embodiment of the present invention.

FIG. 3(a) shows data block 300, which exemplifies an ECC-encoded data block created by ECC module 103, in accordance of one embodiment of the present invention. As shown in FIG. 3, ECC-encoded data block 300 is a 603-bit datum that includes two portions: (a) header code word 303, and (b) stored field 307. Head code word 303 includes (i) header 303a, and (ii) header error detection bits 303b, while stored field 307 includes (i) encrypted 512-bit datum 301, (ii) 7-bit metadata field 302, and (iii) 51-bit ECC check bits 304. Specifically, header 303a includes information associated with encrypted datum 301, which may help validate subsequent accesses to the stored, encoded datum 301. For example, header 303a is provided header error detection bits 303b as its own data integrity check (e.g., a 1-bit parity bit, under an odd or an even parity scheme). Datum 301 is the encrypted datum received from data security module 102, to be stored into QV memory 104. Metadata field 302 are bits that are stored with encrypted datum 301, representing information regarding the stored encrypted datum 301 (e.g., one or the bits may be set by a refresh operation to indicate that encrypted datum 301 may have one or more corrupted bits, as discussed below), or any other suitable information. A block code (e.g., BCH codes, including bit-oriented BCH codes, and Reed-Solomon codes) may be used to create ECC-encoded data block 300. In one embodiment, the ECC-encoding scheme uses a (603, 552) code, which provides 51-bit ECC check bits 304.

According to one embodiment, header 303a may be, for example, a logical address which controller 101 maps to a physical address in QV memory 104, where stored field 307 is to be stored. In that embodiment, header code word 303 is used only to generate the 51-bit ECC check bits and is not itself stored in QV memory 104. QV memory 104 stores only stored field 307. In a subsequent read operation on stored field 307, controller 101 regenerates or recalls header 303a and combines it with retrieved stored field 307 to reconstitute encoded data block 300. During decoding, if the syndromes derived from ECC check bits 304 indicate that an error is present in the present header code word—e.g., when the header code word differs from the one used for storing stored field 307—such an error would be deemed uncorrectable. Such an error may indicate, for example, that the read request from host computer system 107 is directed to an incorrect memory location.

In other embodiments, header 303a may include, for example, bits that encode access control information (e.g., system or user access privileges). In some embodiments, header 303a may be a hash value. In many applications, the logical address (or a hash value of the logical address) is deemed more essential information to include. In some embodiments, header error detection bits 303b may be check bits of an error detection code over header code word 303. In this example, as encrypted datum 301, metadata field 302 and ECC-check bits 304 together require 570 bits, ECC-encoding over the Galois field of size 1024 (i.e., $GF(2^{10})$) may be selected. In that case, the size of header code word 303 may be between 0 and 453 bits, inclusive.

Figure 3B:
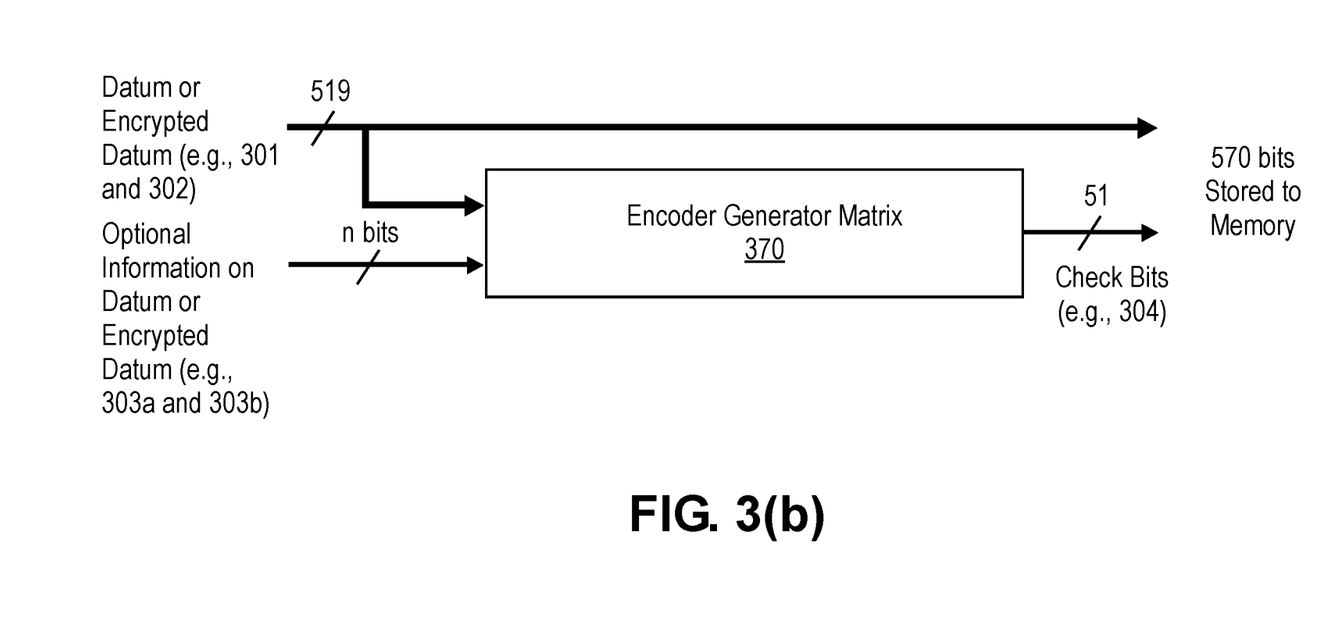
FIGS. 3(b) and 3(c) illustrate an exemplary encoder and an exemplary decoder that may be used to implement ECC module 103.
Figure 3C:
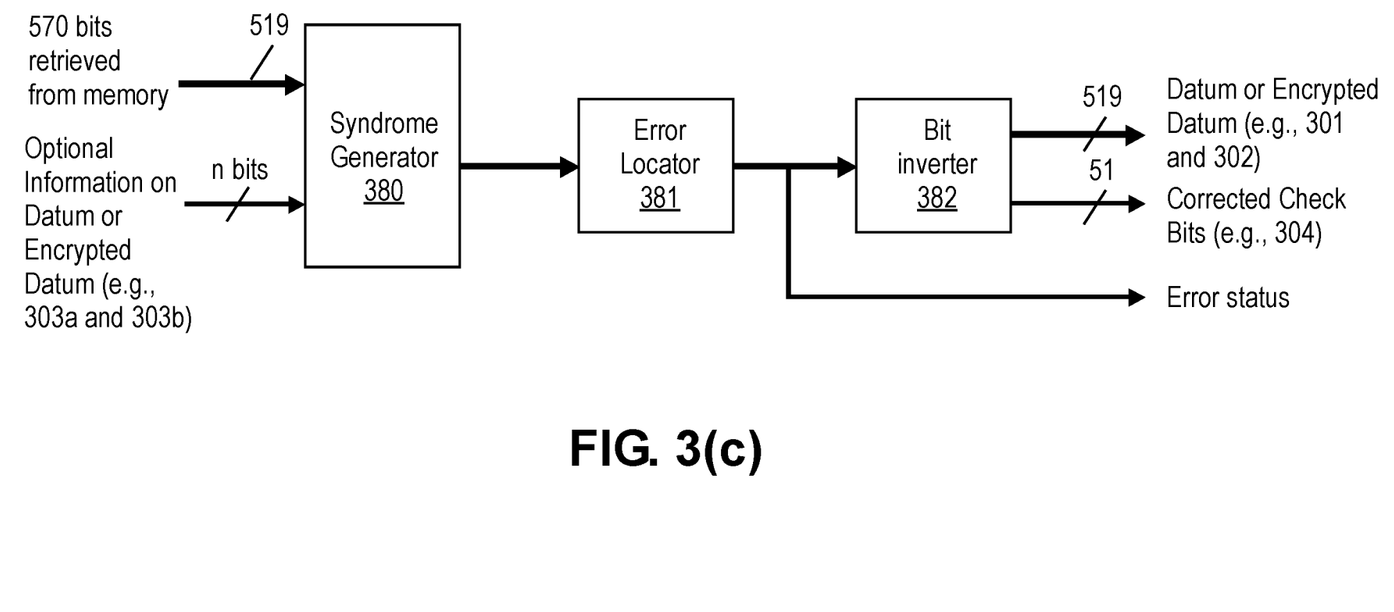

FIGS. 3(b) and 3(c) illustrate an exemplary encoder and an exemplary decoder that may be used to implement ECC module 103. As illustrated in FIG. 3(b), during a write operation, ECC module 103:
(i) prepares n-bit header code word 303 (e.g., header 303a and header error detection bits 303b);
(ii) combines header code word 303 with metadata field 302 and encrypted datum 301 (e.g., by concatenation) to form a (519+n)-bit message for encoding;
(iii) in encoding circuit 370 ("encoder generator matrix"), generates ECC-encoded data block 300 by encoding the (519+n)-bit message, thereby providing 51-bit ECC check bits 304; and
(iv) extracts 570-bit stored field 307 from encoded data block 300; and
(v) sends 570-bit stored field 307 to QV memory 104, along with a physical address, for storing stored field 307.

As illustrated in FIG. 3(c), during a read operation, ECC module 103:
(i) prepares n-bit header code word 303 that was previously used in the ECC-encoding (e.g., header 303a and header error detection bits 303b);
(ii) in a read operation, retrieves from QV memory 104 570-bit stored field 307, stored field 307 including the 519 bits that include metadata field 302, encrypted datum 301, ECC check bits 304 and 51-bit check bits 304;
(iii) concatenate n-bit header code word 303 to stored field 307 to reconstitute ECC-encoded data block 300;
(iv) based on ECC check bits 304, computes syndromes of ECC-encoded data code word 300 in syndrome generator 381;
(v) based on the computed syndromes, detects and locate errors in error locator 381 (e.g., by algebraic decoding or by generating a error-locating polynomial and applying a Chien search), and corrects in bit inverter 382 all errors detected and located in ECC-encoded data block 300; and
(v) returns to data security module 102 (a) decoded encrypted datum 301, and (b) an error code.

The error code may indicate, if one or more errors are found, the number of errors detected and corrected. Some errors may not be correctible.

Errors may develop in stored field 307 while in QV memory 104. With a raw error probability ($P_{raw}$) of about $1.0 \times 10^{-6}$, using the ECC encoding scheme described above, not correcting for such errors would result in a probability that an uncorrectable error develops in any code word within a 24-hour period is $3.3 \times 10^{-10}$. Even when the capacity of QV memory 104 is as small as 100 megabytes (MB), the number of possible ECC-encoded code words with uncorrectable errors in a 24-hour period would become unacceptable. As QV memory 104 is associated with a refresh mechanism, one possible convenient occasion for correcting such errors is during a refresh operation. However, ECC-decoding requires the bits of header code word 303, which is generated in controller 101. When controller 101 is implemented on a separate substrate than QV memory 104, detecting and correcting such errors is undesirable both in power and in the required bandwidth over data interface 106 between controller 101 and QV memory 104. According to one embodiment of the present invention, a method capable of detecting an odd number of errors in stored field 307 can be conveniently carried out in QV memory 104, without requiring stored field 307 be sent to controller 101. In that method of the present invention, when an error is detected, stored field 307 may be labeled using one or more bits in metadata field 302. Controller 101 may be interrupted at the time of detection of the errors to allow controller 101 to retrieve corrupted stored field 307 for correction. For ECC-encoded data block 300 with no error or an even number of errors, correction may be performed when a subsequent read operation uncovers an additional odd number of corrupted bits in stored field 307.

Figure 4:
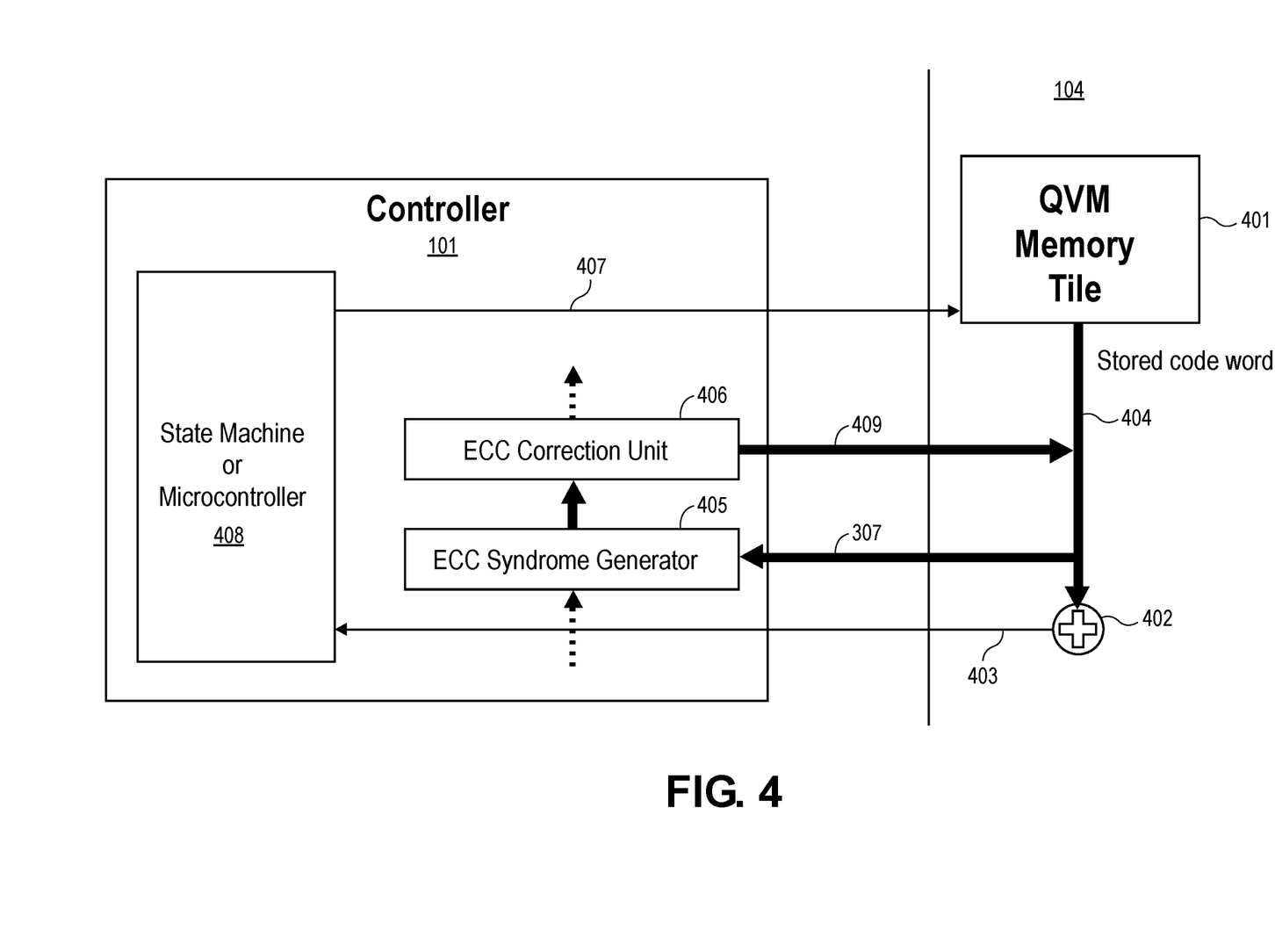
FIG. 4 illustrate a method for detecting certain errors in stored field 307 without requiring decoding at ECC module 103, according to one embodiment of the present invention.

FIG. 4 illustrates a method for detecting certain errors in stored field 307 without requiring decoding at ECC module 103, according to one embodiment of the present invention. The method of FIG. 4 relies on stored field 307 having a known parity, either odd or even. For example, if the code used to ECC-encode data block 300 has an even distance and header code word 303 is also encoded using a code of even distance, stored field 307 has even parity. In other words, where ECC-encoded data block 300 has even parity, the parity of stored field 307 would be even, when header code word 303 also has even parity. In this example, the NOR memory strings in QV memory 104 are organized as 3-dimensional arrays each with a modular footprint ("tile"). A refresh operation involves 512, 1024, 2048 or any suitable number of data bits within a tile. In the examples of this detailed description, as each 512-bit of data is embedded in a 570-bit stored field with 7 bits of metadata and 51 bits of ECC check bits, the refresh operation involves reading, modifying and writing 570 bits simultaneously. As shown in FIG. 4, microcontroller or state machine 408 in controller 101 send enable signal 407 to enable a refresh operation in tile 401 of QV memory 102.

During a refresh operation, the 570-bit stored field 307 to be refreshed is read from tile 401 onto data bus 404. Parity circuit 402 computes the global parity of the 570-bit stored field 307 on data bus 404.—i.e., $gp(a) = a_0 \oplus a_1 \oplus a_2 \oplus \ldots \oplus a_{568} \oplus a_{569}$—where a is the 570-bit datum in stored field 307 and $a_0, a_1, a_2, \ldots, a_{569}$ are the bits of a. If stored field 307 has an odd number of corrupted bits, the computed parity would be different from the expected parity. One of the bits in metadata field 302 of stored field 307 is then set to indicate the detected error. Parity circuit 402 may assert interrupt signal 403 to controller 101, thereby causing controller 101 to perform a "parity scrub." The parity scrub on stored field 307 includes:
(i) generating the corresponding header word 303 for stored field 307;
(ii) latching stored field 307 into ECC syndrome generator 405 to reconstitute ECC-encoded data block 300;
(iii) evaluating the syndromes corresponding to the reconstituted ECC-encoded data block 300 in ECC syndrome generator 405;
(iv) providing the results to ECC correction unit 406 to correct the corrupted bits in ECC-encoded stored field 307; and
(v) writing the corrected ECC-encoded data block 409 back into tile 401.

Of course, the global parity of stored field 307 cannot distinguish between having no error in stored field 307 or having an even number of error bits in stored field 307. In both situations, the refresh operation completes by simply writing stored field 307 back into tile 401. At the presumed raw error probability (i.e., $P_{raw} = 1.0 \times 10^{-6}$), single errors are few but two or more errors are rare, such that a parity scrub should be an infrequent occurrence.

Note that upon power-up, the state of each storage transistor (i.e., "programmed" or "erased") in QV memory 104 is unknown. To avoid such unknown states from causing an excessive number of parity scrubs, QV memory 104 may be configured to carry out an initialization step, to be invoked at the user's option, in which the storage transistors are set to a predetermined pattern (e.g., all erased, all programmed, or any desirable pattern) in bulk upon power-up. In some embodiments, where multiple tiles (e.g., 128 tiles) share a word line, the storage transistors of the multiple tiles associated with that word line may be simultaneously erased or programmed. The error correction codes (e.g., block codes) used in the examples of this detailed description all include 0—which may be represented, for example, by storage transistors that are all erased or all programmed—as a valid code word. Thus, an ECC-encoded data block may be represented by 0 (i.e., an all-zero header code word 303 and erased stored field 307). Unless an error has developed in erased stored field 307, no parity scrub would be requested. In fact, a detection circuit for the all-zero configuration may be provided to indicate that a refresh operation is not needed for that data block, as a memory location that has not been written into need not be refreshed. Alternatively, one of the bits in metadata field 302 of stored field 307 may be used to indicate—by its erased state—that stored field 307 has yet to written valid data.

The above detailed description is provided to illustrate specific embodiments of the present invention and is not intended to be limiting. Numerous variations and modifications are possible within the scope of the present invention. The present invention is set forth in the accompanying claims.

I claim:

1. A memory system, comprising:
a memory circuit comprising a global parity evaluation circuit and a memory array, the memory array including a plurality of quasi-volatile ("QV") memory units, wherein (i) each QV memory unit is configured to store a first portion of a code word, the code word ("ECC-encoded code word") being encoded under an error-detecting and error-correcting scheme; and (ii) the global parity evaluation circuit is configured to determine, when the first portion of a ECC-encoded code word stored in one of the QV memory units is read, a global parity of that ECC-encoded code word;
a refresh circuit configured to read and to write back the first portion of the ECC-encoded code word of a selected one of the QV memory units, wherein the refresh circuit is configured to set, prior to writing back the first portion of the ECC-encoded code word, a parity error value based on the determined global parity of the ECC-encoded code word of the ECC-encoded word of the selected QV memory unit; and
a memory controller, formed on a different substrate than the memory circuit, configured for controlling operations carried out in the memory array, wherein, when the parity error value indicates a parity error, the memory controller (i) performs error correction on the ECC-encoded code word and (ii) causes the first portion of the corrected ECC-encoded code word to be written back to the selected memory unit.

2. The memory system of claim 1, wherein the first portion of the ECC-encoded code word includes check bits under the error-detecting and error-correcting scheme.

3. The memory system of claim 1, wherein the first portion of the ECC-encoded code includes an encrypted datum.

4. The memory system of claim 3, wherein each ECC-encoded code word is encoded using a second portion representing information regarding the encrypted datum, and wherein the second portion is not stored in one of the QV memory units.

5. The memory system of claim 4, wherein the information comprises a logical address designating one of the memory units.

6. The memory system of claim 4, wherein the second portion comprises a hash value of the information.

7. The memory system of claim 1, wherein each memory unit comprises a page of data that is written or read using a single word line.

8. The memory system of claim 1, further comprising an interface between the memory controller and the memory array.

9. The memory system of claim 8, wherein the interface comprises, between the memory array and the memory controller, connections implemented by wafer-bonding or hybrid bonding, or through an interposer structure.

10. The memory system of claim 1, wherein the predetermined global parity indicates an odd number of errors in the ECC-encoded code word.

11. The memory system of claim 1, wherein the ECC-encoded code word has an even Hamming distance.

12. The memory system of claim 1, further comprising an interface to a host memory system over which a host computer sends read and write requests to the controller.

13. The memory system of claim 12, wherein each write request specifies an encrypted datum.

14. The memory system of claim 12, wherein each write request specifies a datum expressed in clear text.

15. The memory system of claim 14, wherein the controller comprises a data security circuit configured to encrypt the clear text datum.

16. The memory system of claim 15, wherein the controller further comprises an error-detecting and error correcting (ECC) circuit that encodes the encrypted datum into the ECC-encoded code word.

17. The memory system of claim 16, wherein the ECC circuit further comprises an ECC syndrome generator that derives from the ECC-encoded code word information for detecting up to a predetermined number of errors in the ECC-encoded code word.

18. The memory system of claim 17, wherein the ECC circuit further comprises an error locator circuit that, based on the information derived in the ECC syndrome generator, determines one or more locations of error in the ECC-encoded code word.

19. The memory system of claim 18, wherein the ECC circuit further includes an error correction circuit that corrects the ECC-encoded code word at the determined error locations.

20. A method for data integrity in a memory circuit comprising a global parity evaluation circuit and a memory array that includes a plurality of quasi-volatile ("QV") memory units each configured to store a first portion of a code word, the code word ("ECC-encoded code word") being encoded using an error-detecting and error-correcting scheme, and wherein the global parity evaluation circuit is configured to determine, when the first portion of a ECC-encoded code word stored in one of the QV memory units is read, a global parity of that ECC-encoded code word, the method comprising:
during a refresh operation on a selected one of the QV memory units,
(i) reading the first portion of the ECC-encoded code word from the selected QV memory unit; and (ii) setting a parity error value associated with the selected QV memory unit based on the global parity determined;

when the parity error value indicates no parity error, writing back the first portion of the ECC-encoded code word read; or, when the error parity value indicates a parity error, a memory controller that is formed on a different substrate than the memory circuit (i) performs error correction on the ECC-encoded code word and (ii) causes the first portion of the corrected ECC-encoded code word to be written back into the selected QV memory unit.

21. The method of claim 20, wherein the first portion of the ECC-encoded code word includes check bits under the error-detecting and error-correcting scheme.

22. The method of claim 20, wherein the first portion of the ECC-encoded code includes an encrypted datum.

23. The method of claim 22, wherein each ECC-encoded code word further includes a second portion representing information regarding the encrypted datum, and wherein the second portion is not stored in one of the QV memory units.

24. The method of claim 23, wherein the information comprises a logical address designating one of the memory units.

25. The method of claim 23, wherein the second portion comprises a hash value of the information.

26. The method of claim 20, wherein each memory unit comprises a page of data that is written or read using a single word line.

27. The method of claim 20, wherein the memory controller and the memory array communicate over an interface.

28. The method of claim 27, wherein the interface comprises, between the memory array and the memory controller, connections implemented by wafer-bonding or hybrid bonding, or through an interposer structure.

29. The method of claim 20, wherein the predetermined global parity indicates an odd number of errors in the ECC-encoded code word.

30. The method of claim 20, wherein the ECC-encoded code word has an even Hamming distance.

31. The method of claim 20, wherein a host computer system sends read and write requests to the controller over an interface.

32. The method of claim 31, wherein each write request specifies an encrypted datum.

33. The method of claim 31, wherein each write request specifies a datum expressed in clear text.

34. The method of claim 31, further comprising encrypting the clear text datum in a data security circuit.

35. The method of claim 34, further comprising encoding the encrypted datum into the ECC-encoded code word using an error-detecting and error correcting (ECC) circuit.

36. The method of claim 34, further comprising deriving from the ECC-encoded code word information for detecting up to a predetermined number of errors in the ECC-encoded code word.

37. The method of claim 36, further comprising, based on the information derived, determining one or more locations of error in the ECC-encoded code word.

38. The method of claim 37, further comprising correcting the ECC-encoded code word at the locations of error determined.

* * * * *